(12) United States Patent
McLaughlin et al.

(10) Patent No.: US 8,373,455 B1
(45) Date of Patent: Feb. 12, 2013

(54) OUTPUT BUFFER CIRCUIT

(75) Inventors: Alan McLaughlin, San Jose, CA (US); Gabriel Li, San Francisco, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 69 days.

(21) Appl. No.: 13/013,725

(22) Filed: Jan. 25, 2011

Related U.S. Application Data

(63) Continuation of application No. 11/904,901, filed on Sep. 27, 2007, now Pat. No. 7,876,133.

(60) Provisional application No. 60/847,554, filed on Sep. 27, 2006.

(51) Int. Cl.
*H03B 1/00* (2006.01)
*H03K 3/00* (2006.01)

(52) U.S. Cl. ........ 327/112; 327/108; 327/109; 327/110; 327/111; 327/170

(58) Field of Classification Search .......... 327/108–112, 327/170
See application file for complete search history.

(56) References Cited

U.S. PATENT DOCUMENTS

| | | |
|---|---|---|
| 4,636,983 A | 1/1987 | Young et al. |
| 4,785,427 A | 11/1988 | Young et al. |
| 4,845,255 A | 7/1989 | Iwahara et al. |
| 4,877,978 A | 10/1989 | Platt |
| 4,890,065 A | 12/1989 | Latetin |
| 4,918,664 A | 4/1990 | Platt |
| 5,124,597 A | 6/1992 | Stuebing et al. |
| 5,132,936 A | 7/1992 | Keswick et al. |
| 5,153,450 A | 10/1992 | Ruetz |
| 5,157,282 A | 10/1992 | Ong et al. |
| 5,162,672 A | 11/1992 | McMahan et al. |
| 5,315,164 A | 5/1994 | Broughton |
| 5,319,252 A | 6/1994 | Pierce et al. |
| 5,319,258 A | 6/1994 | Ruetz et al. |
| 5,345,112 A | 9/1994 | Nazarian et al. |
| 5,347,183 A | 9/1994 | Phelan |
| 5,361,003 A | 11/1994 | Roberts |
| 5,362,997 A | 11/1994 | Bloker |
| 5,381,370 A | 1/1995 | Lacey et al. |
| 5,383,157 A | 1/1995 | Phelan |
| 5,410,191 A | 4/1995 | Miura |
| 5,444,406 A | 8/1995 | Horne |
| 5,469,558 A | 11/1995 | Lieberman et al. |
| 5,489,858 A | 2/1996 | Pierce et al. |
| 5,512,854 A | 4/1996 | Park |
| 5,561,792 A | 10/1996 | Ganapathy |
| 5,563,605 A | 10/1996 | McEwan |
| 5,583,457 A | 12/1996 | Horiguchi et al. |
| 5,600,271 A | 2/1997 | Erickson et al. |
| 5,682,114 A | 10/1997 | Ohta |

(Continued)

FOREIGN PATENT DOCUMENTS
EP 0315473 A2 5/1989

OTHER PUBLICATIONS

U.S. Appl. No. 11/904,901: "Output Buffer Circuit," Alan McLaughlin, filed Sep. 27, 2007; 27 pages.

(Continued)

*Primary Examiner* — Lincoln Donovan
*Assistant Examiner* — Adam Houston

(57) ABSTRACT

An output driver circuit can include at least a first driver transistor having a source-drain path coupled between a first power supply node and an output node. A first variable current supply can generate a current having at least one component that is inversely proportional to a power supply voltage. A first driver switch element can be coupled in series with the first variable current supply between a gate of the at least first driver transistor and a second power supply node.

14 Claims, 4 Drawing Sheets

U.S. PATENT DOCUMENTS

| | | | |
|---|---|---|---|
| 5,708,597 A | 1/1998 | Kelem | |
| 5,732,027 A * | 3/1998 | Arcoleo et al. | 365/189.05 |
| 5,767,736 A * | 6/1998 | Lakshmikumar et al. | 327/536 |
| 5,864,506 A * | 1/1999 | Arcoleo et al. | 365/189.05 |
| 5,933,025 A * | 8/1999 | Nance et al. | 326/81 |
| 5,933,039 A | 8/1999 | Hui et al. | |
| 5,959,479 A | 9/1999 | Woodward | |
| 6,055,287 A | 4/2000 | McEwan | |
| 6,060,922 A | 5/2000 | Chow et al. | |
| 6,107,844 A * | 8/2000 | Berg et al. | 327/110 |
| 6,124,741 A * | 9/2000 | Arcus | 327/112 |
| 6,167,528 A | 12/2000 | Arcoleo | |
| 6,313,682 B1 * | 11/2001 | Muller et al. | 327/291 |
| 6,414,516 B1 * | 7/2002 | Labram et al. | 326/83 |
| 6,504,666 B1 * | 1/2003 | Patti et al. | 360/68 |
| 6,580,359 B1 * | 6/2003 | Tam | 340/14.1 |
| 6,680,656 B2 * | 1/2004 | Chen | 331/143 |
| 6,734,700 B2 * | 5/2004 | Chiu et al. | 326/27 |
| 6,762,634 B1 | 7/2004 | Hattori | |
| 6,853,227 B2 | 2/2005 | Latetin | |
| 7,130,225 B1 * | 10/2006 | Terrovitis | 365/189.09 |
| 7,138,841 B1 * | 11/2006 | Li et al. | 327/175 |
| 7,224,195 B2 * | 5/2007 | Pilling et al. | 327/112 |
| 7,230,466 B2 * | 6/2007 | Park | 327/176 |
| 7,233,165 B2 * | 6/2007 | Jordy | 326/29 |
| 7,236,018 B1 * | 6/2007 | Wang et al. | 327/108 |
| 7,248,083 B2 * | 7/2007 | Chung | 327/108 |
| 7,274,254 B2 * | 9/2007 | Hsieh | 330/51 |
| 7,279,941 B2 * | 10/2007 | Yonezawa et al. | 327/101 |
| 7,321,246 B2 * | 1/2008 | Nishimura | 327/112 |
| 7,323,898 B2 * | 1/2008 | Sartschev | 324/750.01 |
| 7,330,053 B2 * | 2/2008 | Brucke et al. | 326/83 |
| 7,332,943 B2 * | 2/2008 | Botti et al. | 327/112 |
| 7,391,239 B2 * | 6/2008 | Lenz | 326/86 |
| 7,427,893 B2 * | 9/2008 | Liu et al. | 330/51 |
| 7,446,597 B2 * | 11/2008 | Yu | 327/538 |
| 7,449,940 B2 * | 11/2008 | Sunairi | 327/541 |
| 7,453,928 B2 * | 11/2008 | Ten et al. | 375/219 |
| 7,474,131 B1 * | 1/2009 | Hoffmann et al. | 327/108 |
| 7,477,075 B2 * | 1/2009 | Kesselring | 326/87 |
| 2002/0130684 A1 * | 9/2002 | Labram et al. | 326/83 |
| 2005/0116737 A1 * | 6/2005 | Pentakota et al. | 326/31 |
| 2006/0019619 A1 * | 1/2006 | Al-Shyoukh et al. | 455/127.1 |
| 2006/0097764 A1 * | 5/2006 | Yeh | 327/170 |
| 2007/0013411 A1 * | 1/2007 | Asaduzzaman et al. | 326/83 |
| 2007/0120582 A1 * | 5/2007 | Chung et al. | 327/112 |
| 2007/0182461 A1 * | 8/2007 | Harvey | 327/112 |
| 2007/0182462 A1 * | 8/2007 | Lee | 327/112 |
| 2007/0237265 A1 * | 10/2007 | Chang | 375/340 |
| 2007/0290728 A1 * | 12/2007 | Tsai | 327/170 |
| 2008/0018376 A1 * | 1/2008 | Godes | 327/376 |
| 2008/0042734 A1 * | 2/2008 | Yu | 327/538 |
| 2008/0054954 A1 * | 3/2008 | Sun | 327/109 |
| 2008/0129348 A1 * | 6/2008 | Shau | 327/108 |
| 2008/0226004 A1 * | 9/2008 | Oh | 375/358 |
| 2008/0290909 A1 * | 11/2008 | Chung | 327/108 |
| 2008/0290911 A1 * | 11/2008 | Williams | 327/109 |
| 2008/0303558 A1 * | 12/2008 | Rho | 327/108 |

OTHER PUBLICATIONS

Cypress Semiconductor, "Cypress Data Book Memories DataCom FCT Logic PC Products," May 1995, pp. i-vii, 2-36 through 2-43, 2-227, 2-258 through 2-268, 6-1 through 6-15, and 6-74 though 6-84; 54 pages.

Cypress Semiconductor, "Programmable Skew Clock Buffer (PSCB)," 1995, pp. 10-130 through 10-139; 13 pages.

Efendovich et al., "Multifrequency Zero-Jitter Delay-Locked Loop," IEEE Journal of Solid-State Circuits, vol. 29, No. 1, Jan. 1994, pp. 67-70; 4 pages.

Griffin et al., "Memory 1996: Complete Coverage of DRAM, SRAM, EPROM, and Flash Memory ICs," Chapter 8, "SRAM Technology," pp. 8-1 through 8-18, Integrated Circuit Engineering Corporation, 1996; 20 pages.

Griffin et al., Memory 1996: Complete Coverage of DRAM, SRAM, EPROM, and Flash Memory ICs, Chapter 7, "DRAM Technology," pp. 7-1 through 7-20, Integrated Circuit Engineering Corporation, 1996; 22 pages.

USPTO Advisory Action for U.S. Appl. No. 08/576,081 dated Jul. 28, 1999; 1 page.

USPTO Advisory Action for U.S. Appl. No. 08/576,081 dated Jul. 31, 1998; 1 page.

USPTO Advisory Action for U.S. Appl. No. 11/904,901 dated Jan. 12, 2010; 2 pages.

USPTO Final Rejection for U.S. Appl. No. 07/682,571 dated Mar. 26, 1992; 4 pages.

USPTO Final Rejection for U.S. Appl. No. 07/991,568 dated Feb. 1, 1994; 5 pages.

USPTO Final Rejection for U.S. Appl. No. 08/576,081 dated Apr. 12, 1999; 13 pages.

USPTO Final Rejection for U.S. Appl. No. 08/576,081 dated Apr. 22, 1998; 7 pages.

USPTO Final Rejection for U.S. Appl. No. 11/904,901 dated Oct. 29, 2009; 7 pages.

USPTO Non-Final Rejection for U.S. Appl. No. 07/007,957 dated Nov. 30, 1987; 3 pages.

USPTO Non-Final Rejection for U.S. Appl. No. 07/246,634 dated Jun. 19, 1989; 3 pages.

USPTO Non-Final Rejection for U.S. Appl. No. 07/298,472 dated Oct. 17, 1989; 2 pages.

USPTO Non-Final Rejection for U.S. Appl. No. 07/675,021 dated Jul. 2, 1991; 6 pages.

USPTO Non-Final Rejection for U.S. Appl. No. 07/682,571 dated Dec. 2, 1991; 4 pages.

USPTO Non-Final Rejection for U.S. Appl. No. 07/945,705 dated Oct. 15, 1993; 9 pages.

USPTO Non-Final Rejection for U.S. Appl. No. 07/956,794 dated Sep. 7, 1993; 3 pages.

USPTO Non-Final Rejection for U.S. Appl. No. 07/991,568 dated Oct. 5, 1993; 5 pages.

USPTO Non-Final Rejection for U.S. Appl. No. 08/103,449 dated Mar. 10, 1994; 4 pages.

USPTO Non-Final Rejection for U.S. Appl. No. 08/111,164 dated Mar. 23, 1994; 3 pages.

USPTO Non-Final Rejection for U.S. Appl. No. 08/228,927 dated Jul. 19, 1994; 4 pages.

USPTO Non-Final Rejection for U.S. Appl. No. 08/576,081 dated Sep. 14, 1999; 7 pages.

USPTO Non-Final Rejection for U.S. Appl. No. 08/576,081 dated Oct. 1, 1997; 6 pages.

USPTO Non-Final Rejection for U.S. Appl. No. 08/576,081 dated Oct. 19, 1998; 9 pages.

USPTO Non-Final Rejection for U.S. Appl. No. 08/777,488 dated Apr. 14, 1997; 3 pages.

USPTO Non-Final Rejection for U.S. Appl. No. 09/006,772 dated May 18, 1998; 7 pages.

USPTO Non-Final Rejection for U.S. Appl. No. 11/014,578 dated Apr. 4, 2006; 6 pages.

USPTO Non-Final Rejection for U.S. Appl. No. 11/904,901 dated Jun. 5, 2009; 6 pages.

USPTO Notice of Allowance for U.S. Appl. No. 07/007,957 dated Jul. 5, 1988; 3 pages.

USPTO Notice of Allowance for U.S. Appl. No. 07/246,634 dated Aug. 14, 1989; 1 page.

USPTO Notice of Allowance for U.S. Appl. No. 07/298,472 dated Jan. 3, 1990; 1 page.

USPTO Notice of Allowance for U.S. Appl. No. 07/675,021 dated Nov. 5, 1991; 2 pages.

USPTO Notice of Allowance for U.S. Appl. No. 07/682,571 dated Jun. 15, 1992; 1 page.

USPTO Notice of Allowance for U.S. Appl. No. 07/945,705 dated Mar. 30, 1994; 1 page.

USPTO Notice of Allowance for U.S. Appl. No. 07/956,794 dated Mar. 17, 1994; 1 page.

USPTO Notice of Allowance for U.S. Appl. No. 07/991,568 dated May 20, 1994; 1 page.

USPTO Notice of Allowance for U.S. Appl. No. 08/103,449 dated Jul. 26, 1994; 1 page.

USPTO Notice of Allowance for U.S. Appl. No. 08/111,164 dated Jul. 12, 1994; 3 pages.
USPTO Notice of Allowance for U.S. Appl. No. 08/228,927 dated Apr. 21, 1995; 2 pages.
USPTO Notice of Allowance for U.S. Appl. No. 08/576,081 dated Jan. 31, 2000; 1 page.
USPTO Notice of Allowance for U.S. Appl. No. 08/777,488 dated May 27, 1997; 1 page.
USPTO Notice of Allowance for U.S. Appl. No. 09/006,772 dated Sep. 28, 1998; 2 pages.
USPTO Notice of Allowance for U.S. Appl. No. 11/014,578 dated Jul. 20, 2006; 6 pages.
USPTO Notice of Allowance for U.S. Appl. No. 11/904,901 dated Feb. 12, 2010; 7 pages.
USPTO Notice of Allowance for U.S. Appl. No. 11/904,901 dated May 27, 2010; 6 pages.
USPTO Notice of Allowance for U.S. Appl. No. 11/904,901 dated Sep. 2, 2010; 4 pages.
USPTO Requirement for Restriction for U.S. Appl. No. 11/904,901 dated Jan. 5, 2009; 5 pages.
USPTO Requirement for Restriction for U.S. Appl. No. 11/904,901 dated Apr. 15, 2009; 6 pages.

* cited by examiner

US 8,373,455 B1

OUTPUT BUFFER CIRCUIT

RELATED APPLICATIONS

This application is a continuation of U.S. Non-Provisional Application Ser. No. 11/904,901 filed Sep. 27, 2007 and claims priority to U.S. Provisional Application No. 60/847,554 filed on Sep. 27, 2006, both of which are incorporated herein by reference.

TECHNICAL FIELD

The present invention relates generally to output buffers and more particularly to single ended output buffers.

BACKGROUND OF THE INVENTION

In an integrated circuit, output buffers are often used at output pins to transfer signals to the signal lines. The transmission of information across the signal lines can be subject to various problems such as impedance mismatch, signal reflection, or irregular output waveform. Typically, output buffers must meet specifications dictated by application, such as maintaining a smooth and robust output waveform.

FIG. 5 shows a block diagram of a conventional output buffer 500 that can drive an output 506 between a high (e.g., VDD) and low (e.g., VSS) level in response to an input signal IN. The conventional output buffer 500 can include control logic 503, a first driver 512, a second driver 514, a p-channel output transistor 515 and an n-channel output driver transistor 517. In response to a logic output signal 502 from control logic 503, first driver 512 can drive a gate of p-channel output transistor 515 between a high power supply level (e.g., VDD) to turn the transistor off, and a low power supply level (e.g., VSS) to turn the transistor on. In an opposite fashion, in response to a logic output signal 504 from control logic 503, second driver 514 can drive a gate of n-channel output transistor 515 between a low power supply level (e.g., VSS) to turn the transistor off, and a high power supply level (e.g., VDD) to turn the transistor on. P-channel output transistor 515 and n-channel output transistor 517 can be large output driving devices and thus include relatively large gates that can present a significant capacitance to their respective drivers (512 and 514).

Control logic 503 can output signals to control the operation of the output buffer. For example, an output 506 can be driven high by turning on p-channel output transistor 515 and turning off n-channel output transistor 517, or can be driven low by turning off p-channel output transistor 515 and turning on n-channel output transistor 517. An output 506 could also be placed in a high impedance state (i.e., tristate) by turning off both output transistors (515 and 517).

A disadvantage of conventional output buffer 500 can be the limited flexibility in meeting variations arising from different applications. While a drive strength of a conventional output buffer 500 can be increased by adding additional driver devices in parallel, doing so may only just meet a minimum output impedance necessary to reduce signal reflections on a transmission line driven by the buffer.

Another disadvantage of conventional output buffer 500 can be sensitivity to operating conditions. While an output buffer 500 can be tuned to meet worst case load conditions, if an actual output transmission line is less than such worst case, it can be difficult to meet driving requirements, such as rise time and fall time, particularly across uncontrollable variations in manufacturing process, differing operating voltages, and/or temperatures.

DETAILED DESCRIPTION

Various embodiments of the present invention will now be described in detail with reference to a number of drawings. The embodiments show output driver circuits that can vary drive strength according to supply voltage conditions and/or provide programmable drive strength. As a result, an output buffer can meet performance requirements over a range of operating voltages. Further, programmability of drive strength can enable the output buffer to be configured to provide a desired signal profile despite variations in transmission line load.

Figure 1:
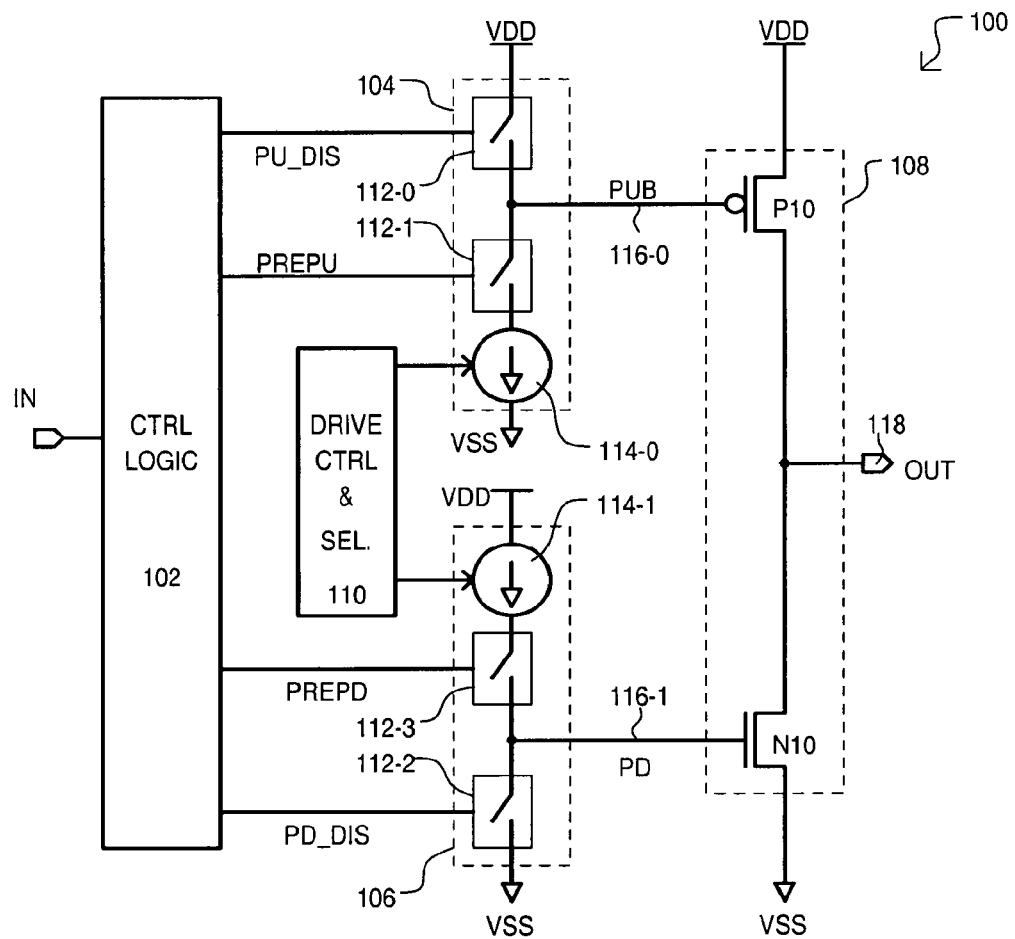
FIG. 1 is a block schematic diagram of a first embodiment of the present invention.

Referring now to FIG. 1, an output driver is shown in a block schematic diagram and designated by the general reference character 100. An output buffer 100 can include control logic 102, pull-up predriver circuit 104, pull-down predriver circuit 106, driver section 108, and current control section 110. Control logic 102 can receive an input signal IN, and in response, generate control output signals for controlling predriver circuits (106 and 104). In the particular example of FIG. 1, such control output signals include a pull-up disable signal (PU_DIS), pull-up enable signal (PREPU), pull-down disable signal (PD_DIS), pull-down enable signal (PREPD).

A pull-up predriver circuit 104 can include a first switch element 112-0, a second switch element 112-1, and a first variable current source 114-0. A first switch element 112-0 can provide a low or high impedance path between a high power supply node VDD and a first driver control node 116-0 in response to signal PU_DIS. A second switch element 114-0 can provide a high or low impedance path between first driver control node 116-0 and first variable current source 114-0 in response to signal PREPU. First variable current source 114-0 can provide a current that is controllable according to current control section 110. More particularly, in response to a current control section 110, a variable current source 114-0 can source a current from first control node 116-0 (provided switch element 112-1 is in a low impedance state) that can vary inversely with respect to a power supply voltage and/or can be programmable.

A pull-down predriver circuit 106 can include a third switch element 112-2, a fourth switch element 112-3, and a second variable current source 114-1. A third switch element 112-2 can provide a low or high impedance path between a low power supply node VSS and a second driver control node 116-1 in response to signal PD_DIS. A fourth switch element 112-3 can provide a high or low impedance path between second driver control node 116-1 and second variable current source 114-0 in response to signal PREPD. Like first variable current source 114-0, second variable current source 114-1 can provide a current controlled by current control section 110 that preferably varies inversely with respect to a power supply voltage and/or can be programmable.

A driver section 108 can include a p-channel insulated gate field effect transistor (hereinafter PFET) P10 and an n-channel FET (NFET) N10. PFET P10 can have a source-drain path connected between a high power supply node VDD and an output node 118. A gate of PFET P10 can be connected to first driver control node 116-0. In such an arrangement, a rising edge of an output signal can be generated at output node 118 by disabling first switch element 112-0 and enabling second switch element 112-1. This can cause a potential at the gate of PFET P10 to fall according to the current drawn by first variable current source 114-0. This is in contrast to conventional arrangements that can drive a gate of an output PFET P10 by switching it to a low power supply VSS. PFET P10 can be disabled by disabling second switch element 112-1 and enabling first switch element 112-0, thereby connecting its gate to a high power supply node VDD. By providing a strong second switch element 112-1, large crowbar currents through output driver can be reduced or avoided as output PFET P10 can be turned off quickly.

NFET N10 can have a source-drain path connected between a low power supply node VSS and an output node 118. A gate of NFET N10 can be connected to second driver control node 116-1. In such an arrangement, a falling edge of an output signal can be generated at output node 118 by disabling third switch element 112-2 and enabling fourth switch element 112-3. This can cause a potential at the gate of NFET N10 to rise according to the current supplied by second variable current source 114-1. This is in contrast to conventional arrangements that can drive a gate of an output NFET by switching its gate to a high power supply VDD. NFET P10 can be disabled by disabling fourth switch element 112-3 and enabling third switch element 112-2, thereby connecting its gate to a low power supply node VSS. As the case of PFET P10, providing a strong fourth switch element 112-3 can reduce or eliminate large crowbar currents through driver section 108.

In this way, an output buffer can include output driver transistors that are enabled in response to current sources sinking or sourcing a current that can vary according to supply voltage and/or are programmable. Thus, drive strength of such devices can be varied without increasing or decreasing the number of driver devices, as is done in some conventional approaches.

Figure 2A:
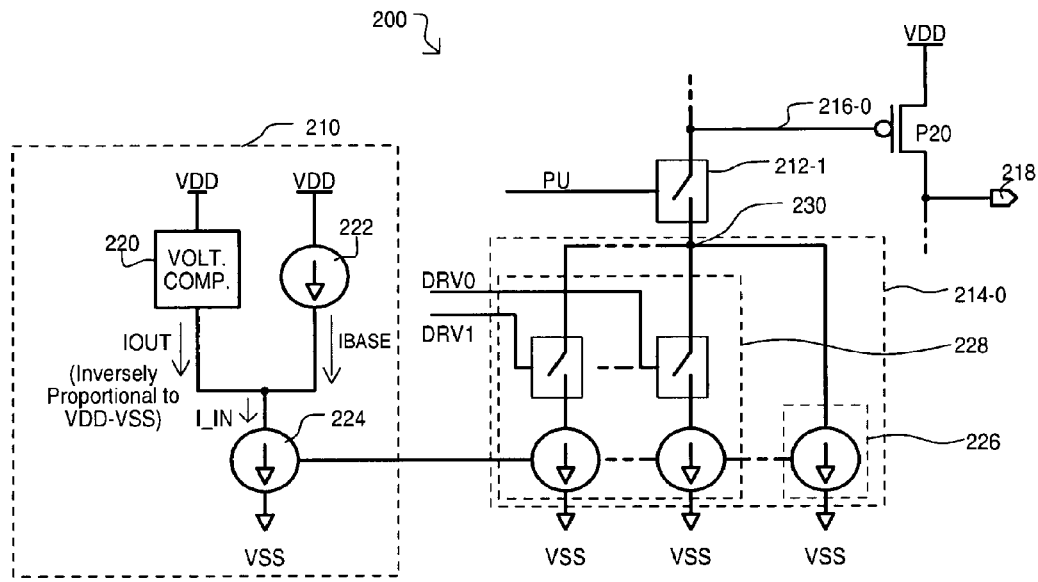
FIGS. 2A and 2B show one way of conceptualizing pull-up and pull-down paths according to an embodiment.
Figure 2B:
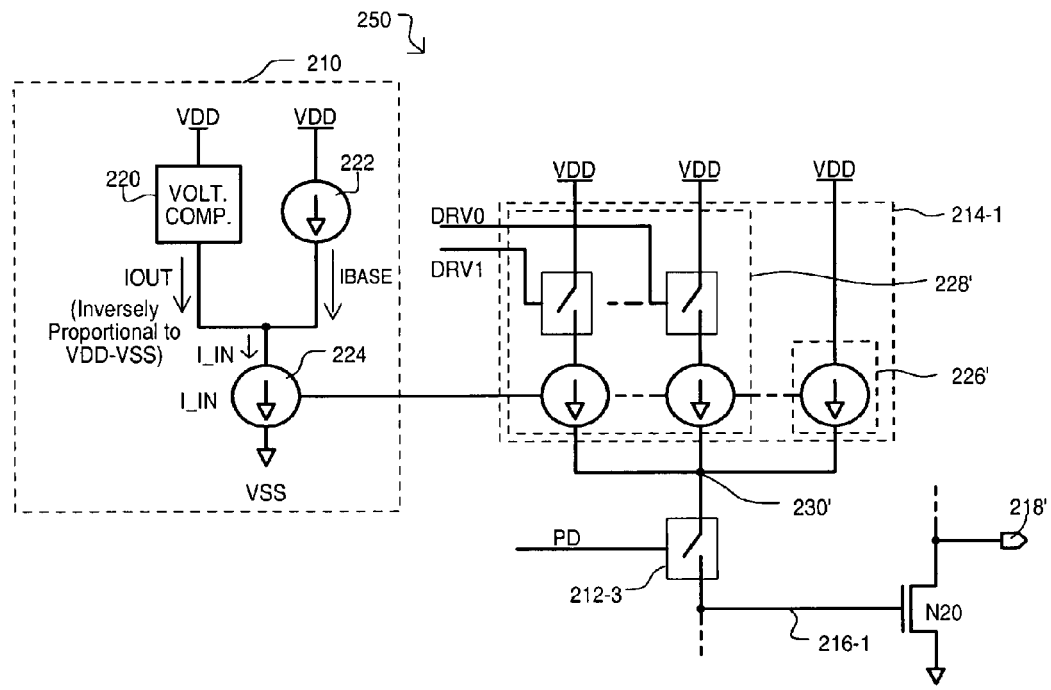

Referring now to FIGS. 2A and 2B portions of an output buffer circuit according to other embodiments are shown in block schematic diagrams. FIG. 2A shows one way of conceptualizing a pull-up path of an output driver. FIG. 2B shows one way of conceptualizing a pull-down path of an output driver.

Referring now to FIG. 2A, a pull-up path is shown in a block schematic diagram and designated by the general reference character 200. A pull-up path 200 can include sections shown in FIG. 1, thus like sections are referred to by the same reference character but with the first digit being a "2" instead of "1". A pull-up path 200 can include current control section 210, switch element 212-1, variable current source 214-0, and output driver PFET P20. A current control section 210 can provide a current I_IN that varies in response to a power supply voltage. In the particular example shown, a current control section 210 can include a voltage compensation circuit 220, a base current source 222, and current mirror source 224. A voltage compensation circuit 220 can provide a current IOUT that varies inversely with power supply voltage. That is, as a power supply voltage increases (e.g., VDD-VSS), current IOUT decreases. Conversely, as power supply decreases, current IOUT can increase. A current IOUT can be added with a constant current IBASE provided by base current source 222, to create a current I_IN for current mirror source 224.

A variable current source 214-0 can include a static section 226 and a programmable section 228. A static section 226 can include a current source that mirrors the current passing through current mirror source 224 and draws current from a current control node 230. Thus, a current drawn by static section 226 can also vary inversely with a power supply voltage. In a similar fashion, a programmable section 228 can include one or more current sources that mirror the current passing through current mirror source 224. Such current sources can be arranged in parallel with one another with respect to current control node 230. However, unlike static section 226, current sources within programmable section 228 can be switched into current control node 228 to vary that amount of current drawn at current control node 230. In the particular example shown, signals DRV0 and DRV1 can control the current sources of programmable section 228.

A switch element 212-1 can selectively connect a driver control node 216-0 to variable current source 214-0, to thereby drive a gate of PFET P20 low, to pull output node 218 toward VDD.

In this way, a pull-up device in an output driver can be controlled by a variable current source sinking a current with a magnitude that is both programmable and inversely related to a power supply level.

Referring now to FIG. 2B, a pull-down path is shown in a block schematic diagram and designated by the general reference character 250. A pull-down path 250 can include sections shown in FIG. 1, thus like sections are referred to by the same reference character but with the first digit being a "2" instead of "1". A pull-down path 250 can include current control section 210, switch element 212-3, variable current source 214-1, and output driver NFET N20.

A current control section 210 can provide a current I_IN in the same fashion as described with reference to FIG. 2A.

A variable current source 214-1 can have the same general configuration as variable current source 214-0, except that current is sourced to a common current control node 230'.

A switch element 212-3 can selectively connect a driver control node 216-1 to variable current source 214-1, to thereby enable NFET N20, and drive output node 218 toward VSS.

In this way, a pull-down device in an output driver can be controlled by a variable current source sourcing a current with a magnitude that is both programmable and inversely related to a power supply level.

FIGS. 2A and 2B thus show how can an output driver to be tuned for a given output transmission line by altering a current drive amount, and not the number of active drivers. Further, such a driving current can be inversely proportional to a power supply voltage and thus be capable of operating over a wide range of power supply levels.

Figure 3:
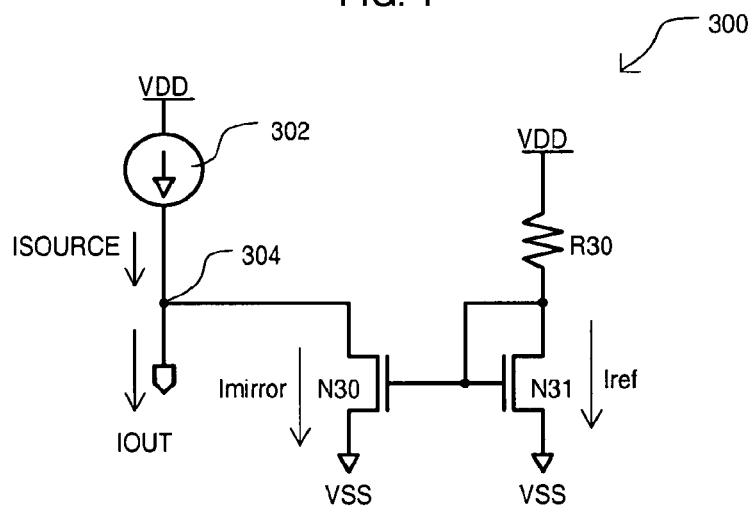
FIG. 3 is a block schematic diagram of a voltage compensation circuit that can be included in the embodiments.

Referring now to FIG. 3, a voltage compensation circuit is shown in a block schematic diagram and designated by the general reference character 300. A voltage compensation circuit 300 can correspond to that shown as 220 in FIGS. 2A and 2B. A voltage compensation circuit 300 can include a current mirror formed by NFETs N30 and N31, a reference load R30, and a current source 302. NFET N31 can have a source connected to a low power supply node VSS, a gate connected to its drain, and a drain connected to reference load R30. NFET N30 can have a source connected to a low power supply node VSS, a gate connected to the gate of N31, and a drain connected to a current out node 304.

As shown in FIG. 3, NFET N31 can draw a current Iref. This current can be mirrored by NFET N30 to draw a current Imirror. That is, if NFETs N30 and N31 are matched in size, such currents can be the same, and if NFETs N30 and N31 are scaled with respect to one another, such currents can vary according to their scaling factor. A current ISOURCE provided by current source 302 can be a constant current.

In the arrangement of FIG. 3, as a power supply voltage increases, current Iref (and hence current Imirror) can increase. This can shunt current away from current out node 304, reducing the magnitude of output current IOUT. On the other hand, as a power supply voltage decreases, current Iref (and hence current Imirror) can decrease. This can shunt less current away from current out node 304, thus output current IOUT can increase in magnitude.

In this way a current can be provided that can be inversely proportional to a power supply voltage.

While the embodiments of FIGS. 2A and 2B show one way of conceptualizing the current drivers, in a preferred embodiment a common voltage compensated current can be utilized to generate a drive current for both pull-up and pull-down devices by a series of current mirrors. An example of such an arrangement is shown in FIG. 4.

Figure 4:
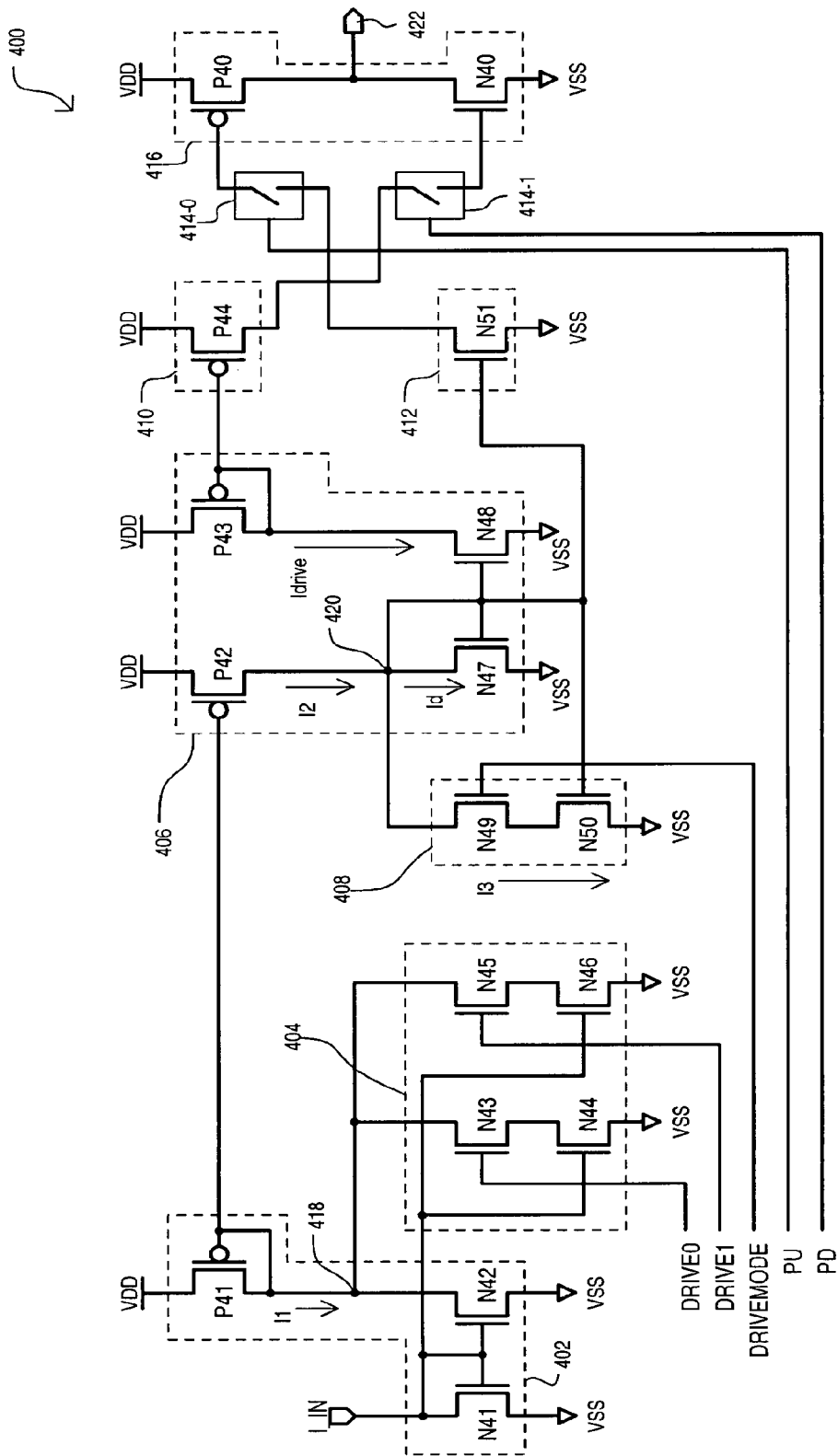
FIG. 4 shows a tuning circuit according to an embodiment of the invention.
Figure 5:
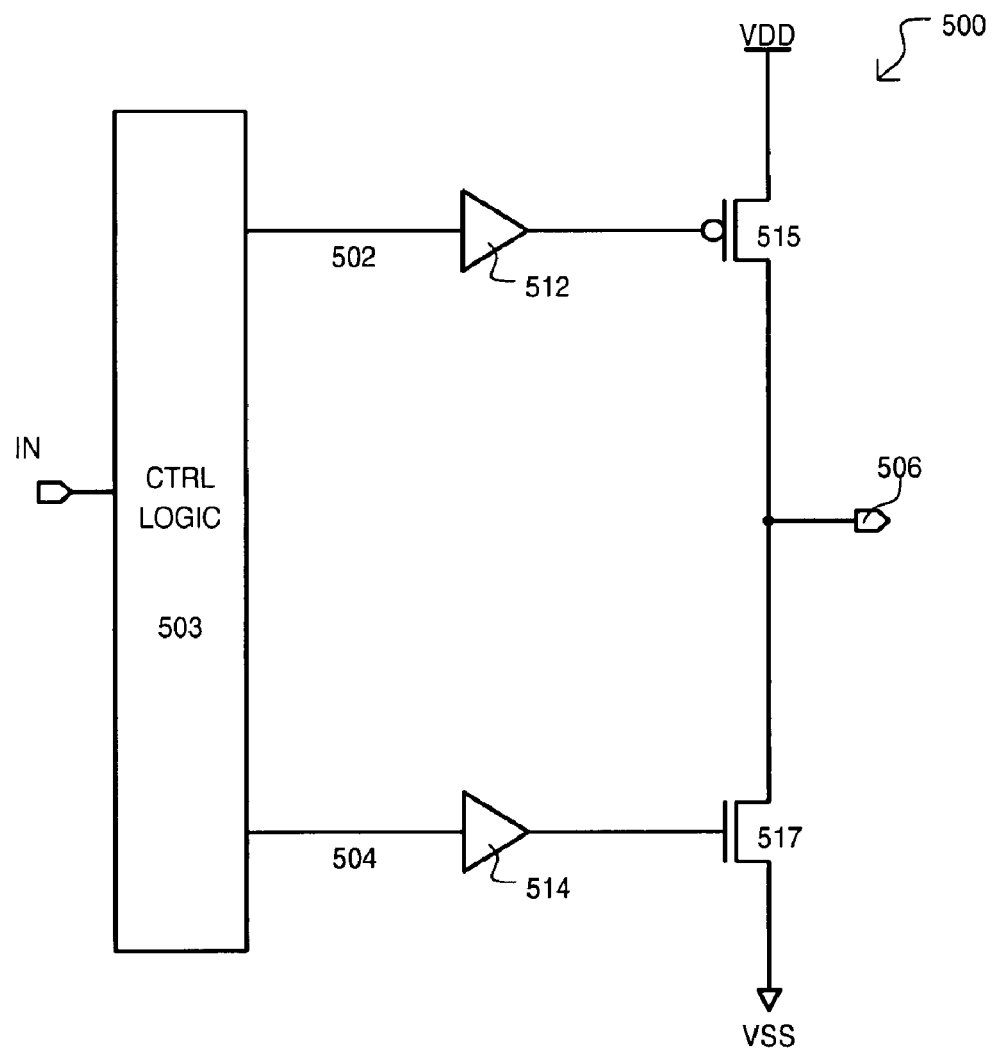
FIG. 5 shows a conventional output driver circuit.

Referring to FIG. 4, an output driver tuning circuit is shown in a schematic diagram and designated by the general reference character 400. A tuning circuit 400 can include an input current circuit 402, a programmable switching section 404, a current driver section 406, a drive strength modulator 408, pull-down current source 410, pull-up current source 412, pull-up switch element 414-0, pull-down switch element 414-1, output driver section 416.

An input current section 402 can include a current mirror formed by NFETs N41 and N42 and load PFET P41. NFET N41 can have a drain that receives a voltage compensated input current I_IN. In one particular arrangement, a current I_IN can be generated by circuits like those shown as 210 in FIGS. 2A and 2B and/or 300 in FIG. 3. That is, current I_IN can be inversely proportional to a supply voltage. Current I_IN can be mirrored by NFET N42 and thus draw current at node 418. Load PFET P41 can be connected to node 418 in a "diode" configuration (its drain and gate connected to the node, its source connected to a high power supply node VDD).

Programmable switching section 404 can include one or more selectable legs to vary the amount of current drawn at node 418. In the particular example of FIG. 4, programmable switching section 404 includes two legs, one formed by series connected NFETs N43/N44, the other leg formed by series connected NFETs N45/N46. NFETs N44 and N45 within each leg can have gates connected to the gate of current mirror N41/N42, and thus can draw a current that mirrors input current I_IN (i.e., these currents are also supply voltage compensated). Each leg of programmable switching section 404 can be enabled by a corresponding drive select signal DRIVE0 or DRIVE1.

In such an arrangement, a current I1 drawn at node 418 can include that drawn by NFET N42, and any additional current draw switched in by switching section 404. Any of NFETs N42, N44 and N46 can be scaled with respect to NFET N41 to provide a desired programmability range.

A current driver section 406 can include mirror PFET P42, a drive current mirror N47/N48, and a drive PFET P43. PFET P42 can be connected in a current mirror fashion to load PFET P41, and thus can provide a current I2 to node 420 that mirrors I1. Drive current mirror N47/N48 can receive a current Id from node 420, and mirror such current to generate a current Idrive that flows from PFET P43 to NFET N48.

A drive strength modulator 408 can include NFETs N49 and N50 arranged in series with one another between node 420 and a low power supply node 408. In such an arrangement, when drive strength modulator is disabled (NFET N49 off), current Idrive can essentially mirror current I2. In contrast, when drive strength modulator is enabled (NFET N49 on), the scaling factor between the different legs of current driver section 406 can be changed, as NFET N50 is added in parallel with NFET N47. As a result current Idrive can be reduced.

Pull-down current source 410 can include a PFET P44 having a gate connected in a current mirror fashion to that of PFET 43. Thus, PFET P44 can source a current that mirrors current Idrive. Similarly, pull-up current source 412 can include an NFET N51 having a gate connected in a current mirror fashion to a gate of NFET N47, and thus sink a current that mirrors current Id (and hence Idrive).

An output driver section 416 can have the same structure as that shown as 108 in FIG. 1, and include driver PFET P40 and driver NFET N40.

Pull-up switch element 414-0 can be connected between a gate of driver PFET P40 and pull-up current source 412. Thus, when pull-up switch element 414-0 is enabled in response to signal PU, driver PFET P40 can drive output node 422 high based on a current Id. In a similar fashion, pull-down switch element 414-1 can be connected between a gate of driver NFET N40 and pull-down current source 410. Thus, when pull-down switch element 414-1 is enabled in response to signal PD, driver NFET N40 can drive output node 422 low based on current Idrive.

Again, due to the current mirroring of tuning circuit 400 currents Id/Idrive are inversely proportional to a power supply voltage.

Output driver circuits according to the embodiments can provide for rise and fall times that can meet a same specification under varying voltage supply conditions, as a drive strength is determined by sinking or sourcing a current that varies with power supply voltage levels.

In addition or alternatively, output driver circuits according to the embodiments can provide for a selectable rise and fall time, by enabling any of multiple current sources to increase and/or decrease a current that controls the drive strength of the output buffer. As but one example, for a worst case load condition, a first number of current sources can be enabled to provide a relatively fast switching speed. For load conditions less than a worst case, fewer current sources can be enabled, thus slowing down the rise/fall times appropriately. Such load-drive matching can reduce electromagnetic interference (EMI) in systems that drive signals between various locations.

Embodiments of the present invention can be employed as output drivers for various integrated circuits. As but one particular example, such an output driver may be particularly suitable for driving an output clock signal that can control the timing of other circuits in a larger system.

Embodiments of the present invention are well suited to performing various other steps or variations of the steps recited herein, and in a sequence other than that depicted and/or described herein. In one embodiment, such a process is carried out by processors and other electrical and electronic components, e.g., executing computer readable and computer executable instructions comprising code contained in a computer usable medium.

For purposes of clarity, many of the details of the improved solution and the methods of designing and manufacturing the same that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects.

What is claimed is:

1. An output driver circuit, comprising:
at least a first driver transistor having a source-drain path coupled between a first power supply node and an output node;
a first variable current supply that generates a current having at least one component that is inversely proportional to a power supply voltage; and
a first driver switch element coupled in series with the first variable current supply between a gate of the at least first driver transistor and a second power supply node, wherein the first driver switch and the first variable current supply are configured to control a rise time of the output driver circuit.

2. The output driver circuit of claim 1, wherein:
the at least first driver transistor includes a p-channel insulated gate field effect transistor, the first power supply node is a high power supply node and the second power supply node is a low power supply node.

3. The output driver circuit of claim 1, further including:
at least a second driver transistor having a source-drain path coupled between the second power supply node and the output node; and
a second variable current supply that generates a current having at least one component that is inversely proportional to the power supply voltage; and
a second driver switch element coupled in series with the second variable current supply between a gate of the at least second driver transistor and the first power supply node, wherein the second driver switch and the second variable current supply are configured to control a fall time of the output driver circuit.

4. The output driver circuit of claim 1, wherein:
the first variable current supply comprises a supply current source that provides source current to a reference current node, and a current mirror that shunts current away from the reference current node.

5. The output driver circuit of claim 4, wherein:
the current mirror includes an output mirror transistor having a source-drain path in series with the supply current source and in parallel with the reference current output node, a reference mirror transistor having a gate coupled to a gate of the output mirror transistor and to its drain, an impedance element coupled to the drain of the reference mirror transistor.

6. The output driver circuit of claim 1, wherein:
the first variable current supply includes a selectable current supply circuit that includes a current mirror having a reference current leg that receives a current having at least one component that is inversely proportional to the power supply voltage, a mirror current leg coupled to a selectable drive current node that mirrors the current flowing in the reference current leg, at least one first selectable mirror leg coupled to the selectable drive current node and coupled to mirror the current flowing in the reference current leg, and a mirror switch coupled in series with the at least one selectable mirror leg that is enabled in response to a drive signal.

7. An output driver circuit, comprising:
a first driver transistor that provides a low impedance path to an output node in response to a voltage at a first driver control node;
a first switch element coupled between the first driver control node and a first power supply node; and
a selectable current source coupled between the first driver control node and a second power supply node, the selectable current source generating a drive current that varies in response to a drive select value,
wherein the selectable current source includes a plurality of selectable current legs, each connected to a current control node and enabled to provide a current to the current control node in response to a corresponding drive control signal.

8. The output driver circuit of claim 7, wherein:
the selectable current source includes a drive current source circuit, and a first drive current switch element coupled in series with the current source circuit between the first driver control node and the second power supply node.

9. The output driver circuit of claim 7, wherein:
the selectable current source further includes a reference current source that provides a reference current having at least one component that is inversely proportional to a power supply voltage, and each of the selectable current legs provides a current proportional to the reference current.

10. The output driver circuit of claim 7, wherein:
the plurality of selectable current legs includes a drive current leg that provides a pre-drive current to a drive node, a drive strength modulator that selectively shunts current from the drive node in response to a drive strength control signal, and the drive current is proportional to the current at the drive node.

11. An output driver circuit, comprising:
a first driver transistor that provides a low impedance path to an output node in response to a voltage at a first driver control node;
a second driver transistor that provides a low impedance path to the output node in response to a voltage at a second driver control node; and
a first switch element coupled between the first driver control node and a first power supply node, and between the second driver control node and the first power supply node, the selectable current source generating a drive current that varies in response to a drive select value.

12. The output driver circuit of claim 11, further including:
a second switch element coupled between the second driver control node and the second power supply node.

13. The output driver circuit of claim 7, further including:
a control logic circuit that selectively enables the first switch element and selectable current source in response to at least one input signal.

14. The output driver circuit of claim 3, wherein:
the second driver transistor includes an n-channel insulated gate field effect transistor, and the first power supply node is a high power supply node and the second power supply node is a low power supply node.

* * * * *